United States Patent
Kamijo et al.

(10) Patent No.: US 10,310,692 B2
(45) Date of Patent: Jun. 4, 2019

(54) DISPLAY DEVICE, TOUCH PANEL AND METHOD OF MANUFACTURING DISPLAY DEVICE

(71) Applicant: Japan Display Inc., Tokyo (JP)

(72) Inventors: Yoichi Kamijo, Tokyo (JP); Yoshikatsu Imazeki, Tokyo (JP); Shuichi Osawa, Tokyo (JP); Yoshihiro Watanabe, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/937,244

(22) Filed: Mar. 27, 2018

(65) Prior Publication Data

US 2018/0284923 A1  Oct. 4, 2018

(30) Foreign Application Priority Data

Mar. 28, 2017  (JP) ................. 2017-063042

(51) Int. Cl.

| H05K 1/11 | (2006.01) |
|---|---|
| G06F 3/044 | (2006.01) |
| H05K 1/14 | (2006.01) |
| H05K 3/40 | (2006.01) |
| G06F 3/041 | (2006.01) |

(52) U.S. Cl.
CPC ............ *G06F 3/044* (2013.01); *G06F 3/0412* (2013.01); *G06F 3/0416* (2013.01); *H05K 1/115* (2013.01); *H05K 1/144* (2013.01); *H05K 3/4053* (2013.01); *G06F 2203/04103* (2013.01); *H05K 2201/09827* (2013.01)

(58) Field of Classification Search
CPC ...... G06F 3/044; G06F 3/0412; G06F 3/0416; G06F 2203/04103; H05K 1/115; H05K 3/4053; H05K 1/144; H05K 2201/09827
See application file for complete search history.

(56) References Cited

FOREIGN PATENT DOCUMENTS

| JP | 2002-040465 A | 2/2002 |
|---|---|---|
| JP | 2009-237410 A | 10/2009 |
| JP | 2012-211951 A | 11/2012 |
| JP | 2016-058483 A | 4/2016 |
| JP | 2016-063114 A | 4/2016 |

*Primary Examiner* — Abhishek Sarma
(74) *Attorney, Agent, or Firm* — K&L Gates LLP

(57) ABSTRACT

According to one embodiment, a display device includes an organic insulating layer located between an first basement and an second basement, a first hole penetrating the second basement and the organic insulating layer, a connecting material provided via the first hole to electrically connects a first terminal and a second terminal to each other and a filling member covering the connecting material and filled in the first hole, and the protective member includes an exposure area in which the filling member is disposed, and a thickness from the second basement to an upper surface of the filling member is substantially equal to a thickness from the second basement to an upper surface of the protective member.

18 Claims, 14 Drawing Sheets

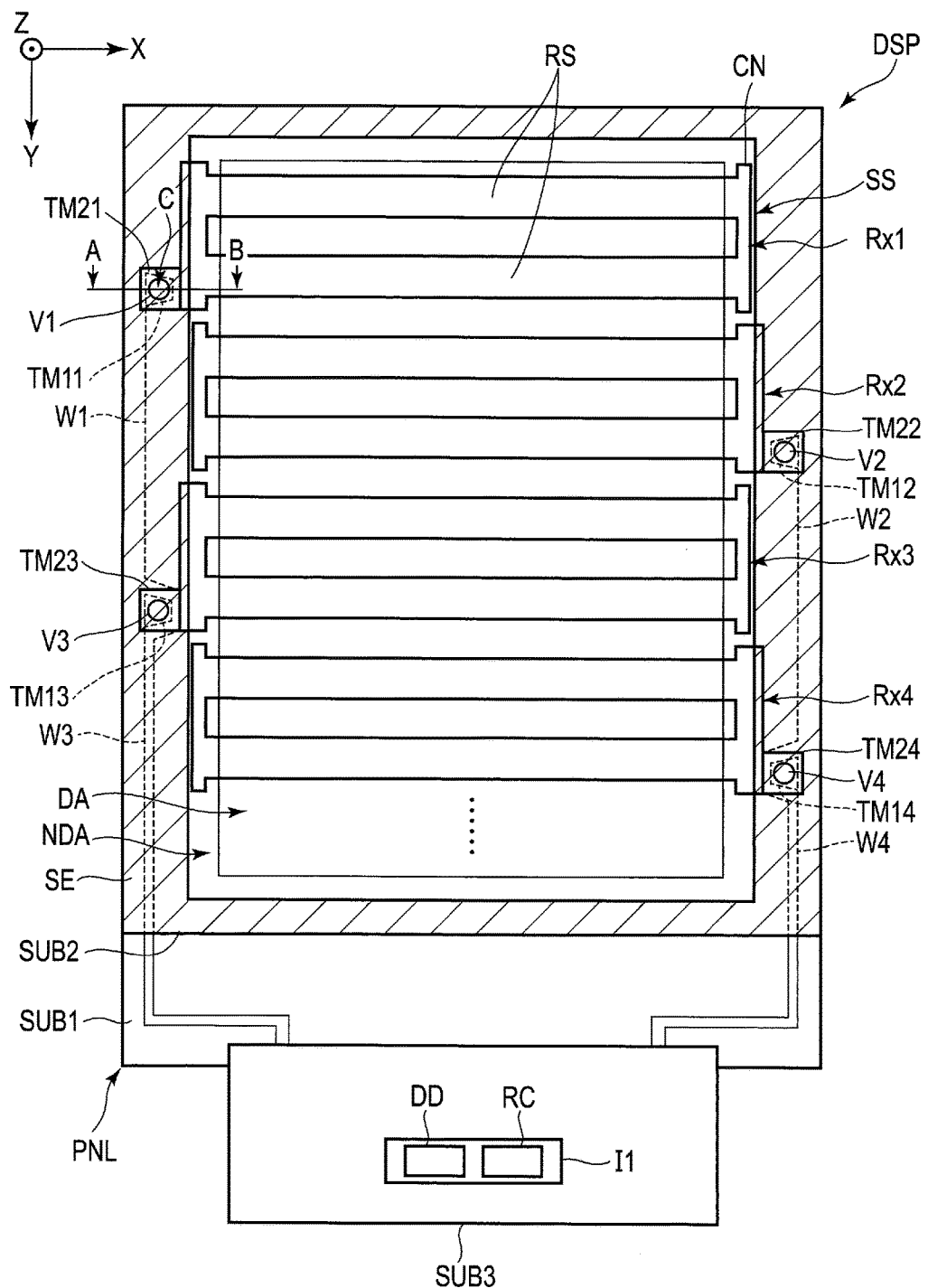
F I G. 1

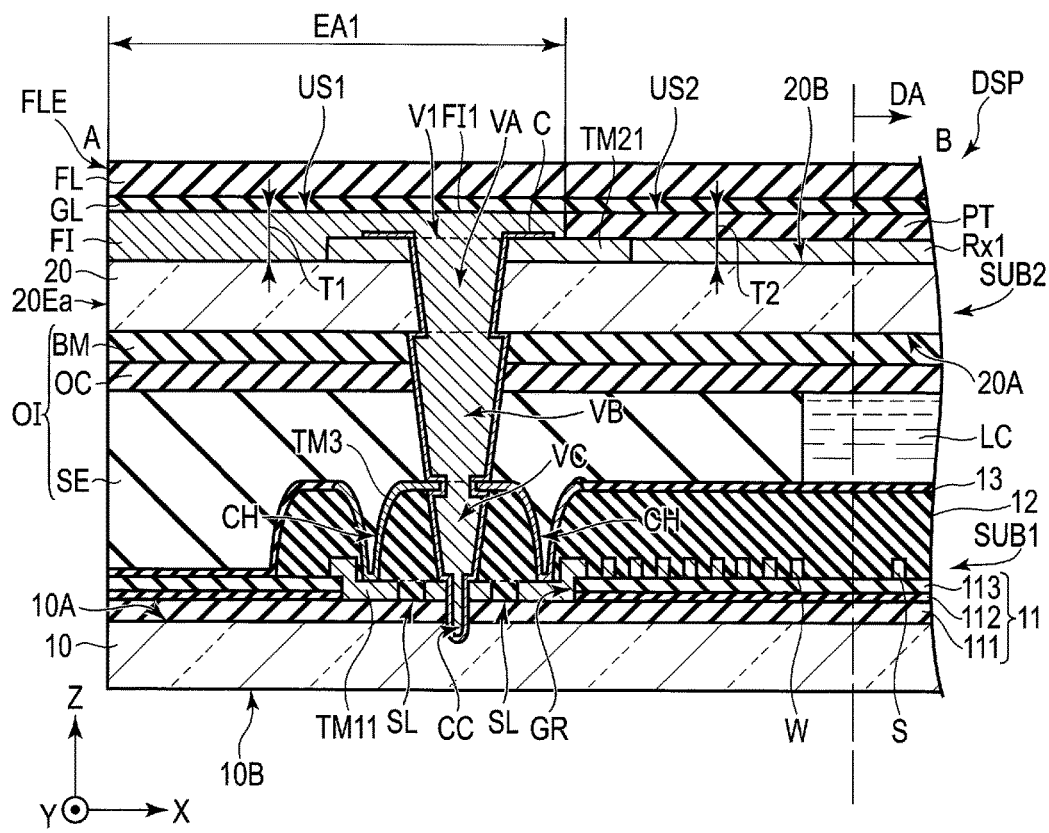
F I G. 2

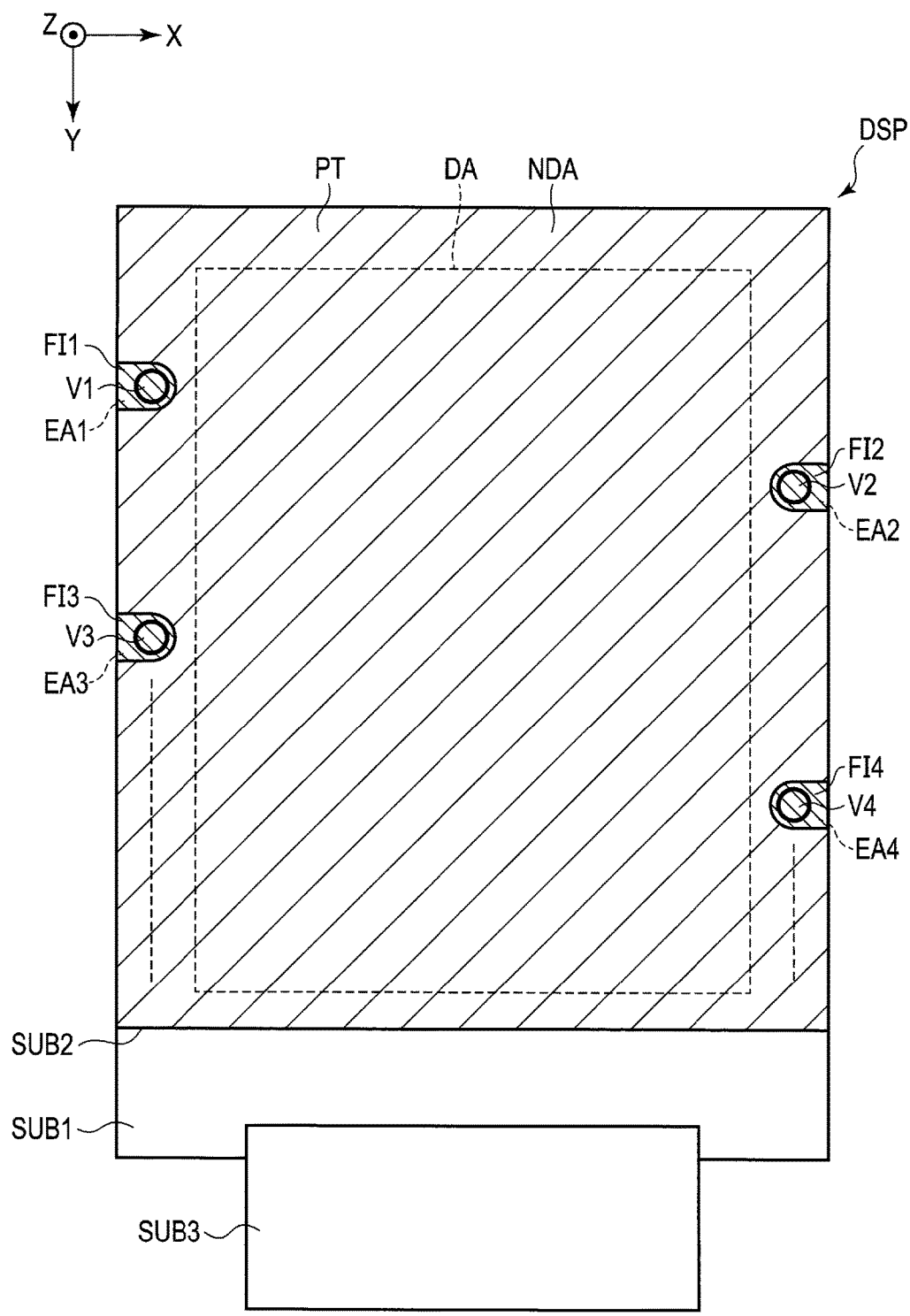
F I G. 3

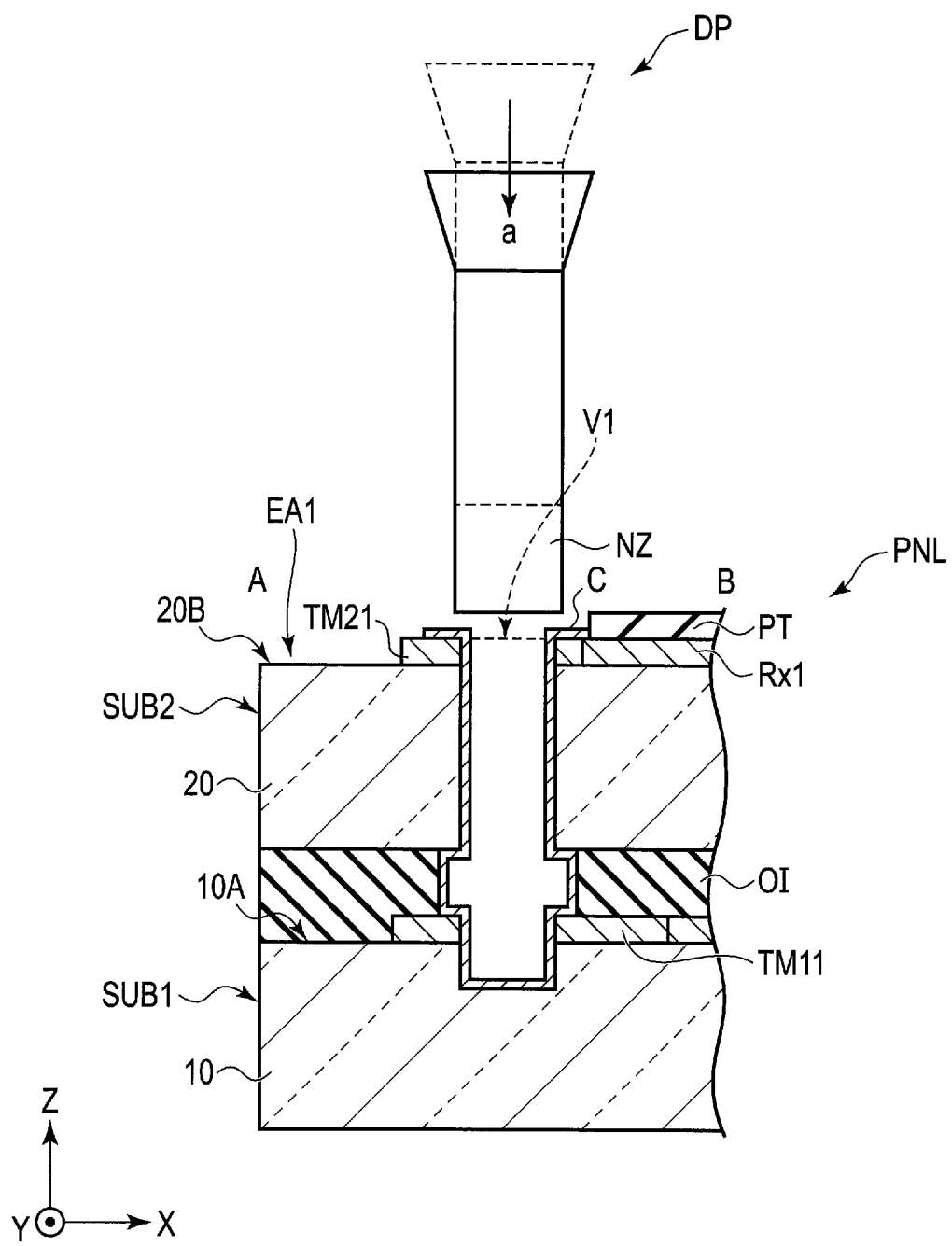
F I G. 6

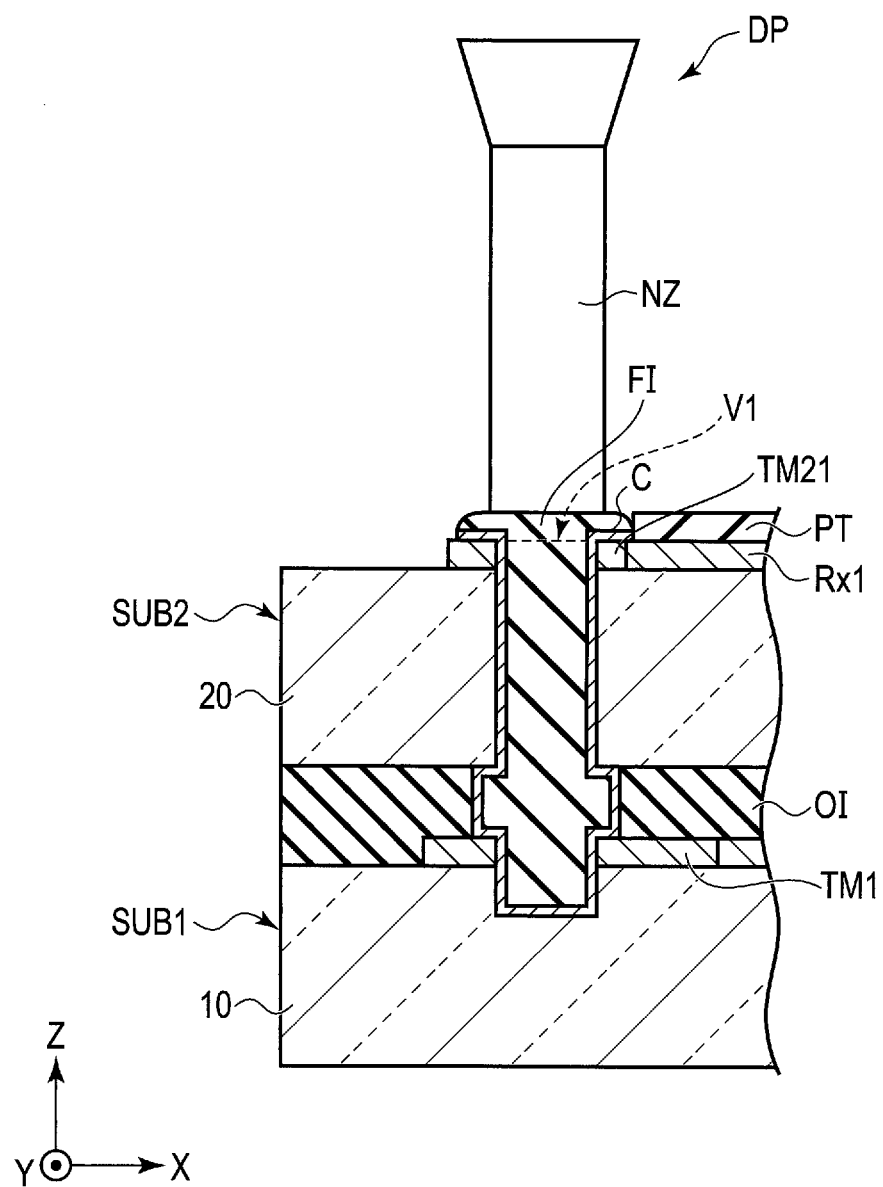
F I G. 7

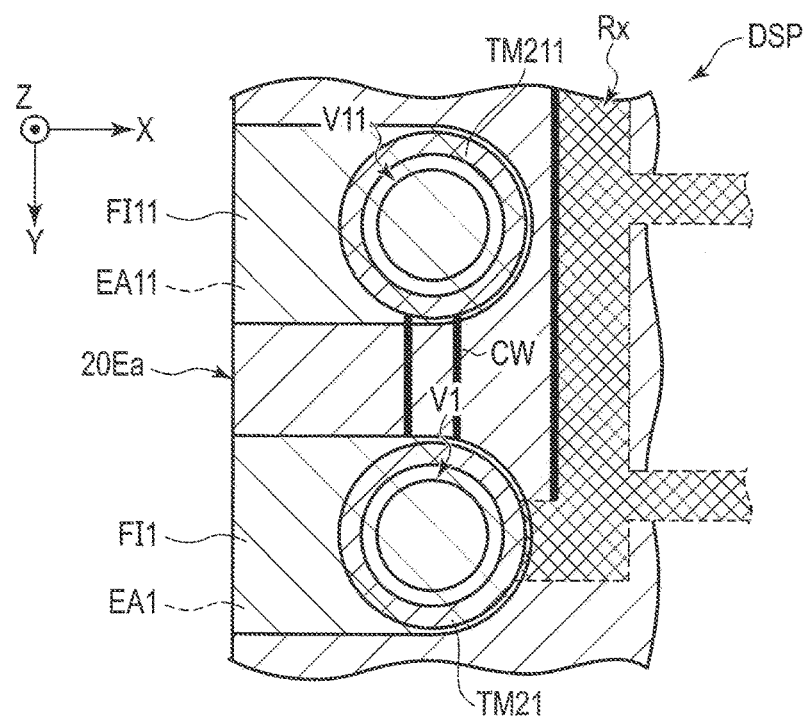
F I G. 12
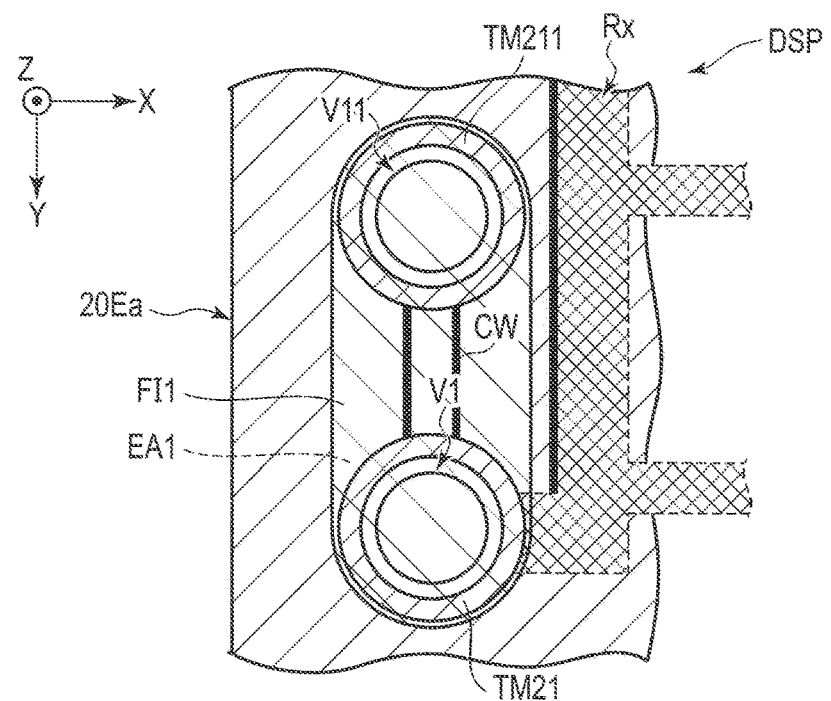
F I G. 13

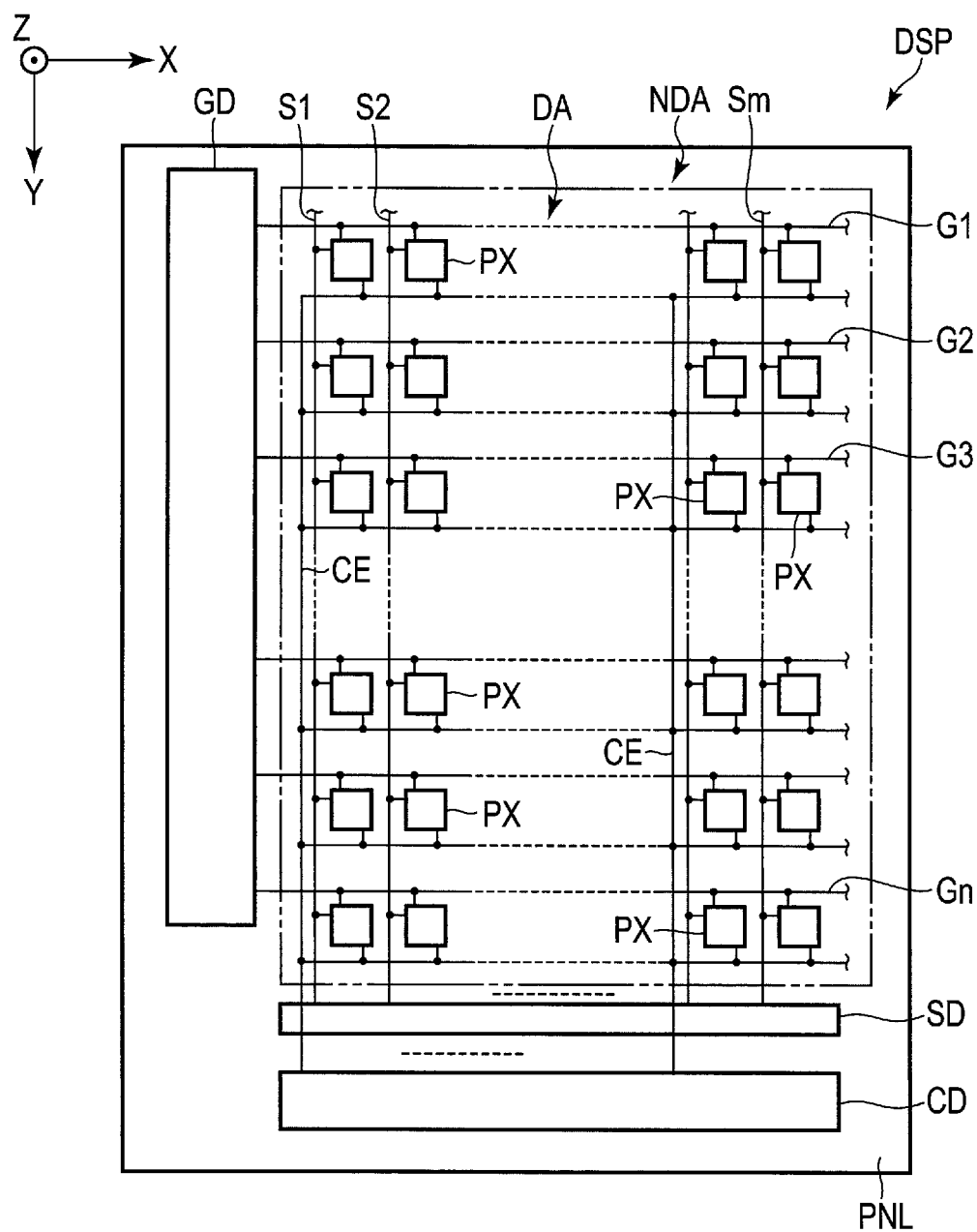
F I G. 14

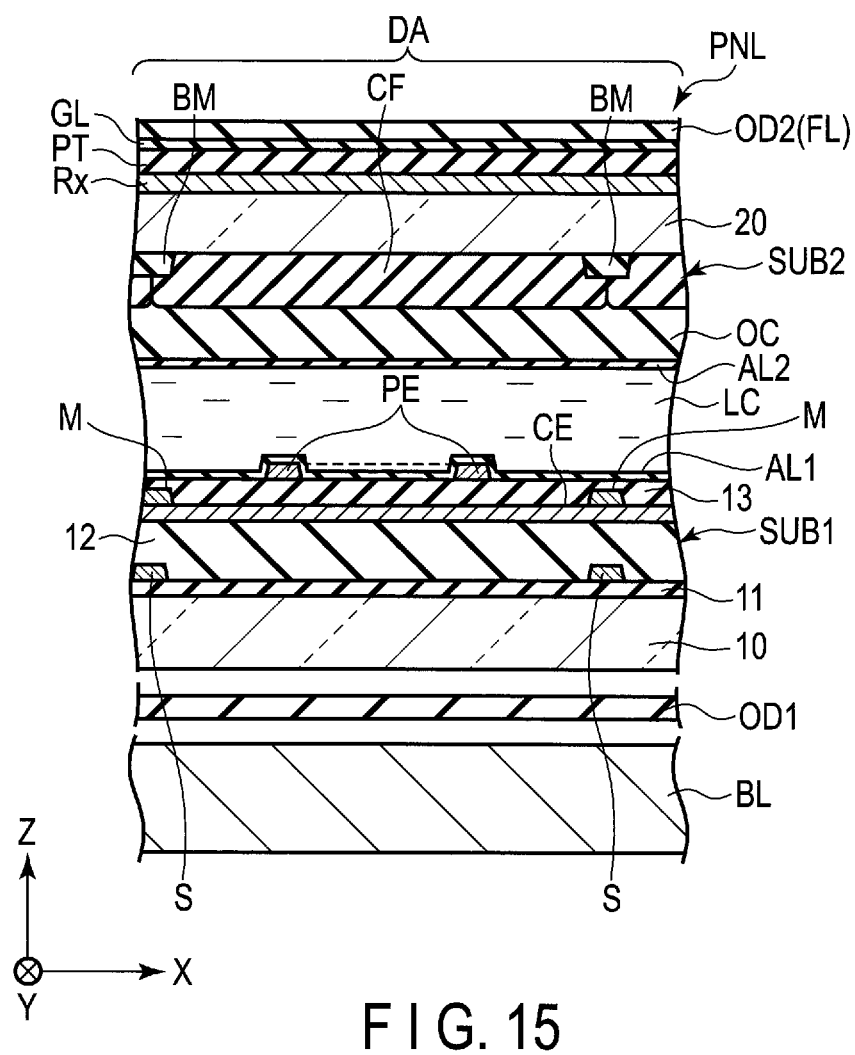
F I G. 15

DISPLAY DEVICE, TOUCH PANEL AND METHOD OF MANUFACTURING DISPLAY DEVICE

CROSS-REFERENCE TO RELATED APPLICATIONS

This application is based upon and claims the benefit of priority from Japanese Patent Application No. 2017-063042, filed Mar. 28, 2017, the entire contents of which are incorporated herein by reference.

FIELD

Embodiments described herein relate generally to a display device, a touch panel and a method of manufacturing the display device.

BACKGROUND

In recent years, various techniques for narrowing the frame of a display device have been considered. For example, a technology of electrically connecting a wiring portion including an in-hole connecting portion inside a hole penetrating an inner surface and an outer surface of a first substrate formed of resin with a wiring portion provided on an inner surface of a second substrate formed of resin, by an inter-substrate connecting portion, has been disclosed.

SUMMARY

The present disclosure relates generally to a display device, a touch panel and a method of manufacturing the display device.

According to one embodiment, a display device includes an organic insulating layer located between an first basement and an second basement, a first hole penetrating the second basement and the organic insulating layer, a connecting material provided via the first hole to electrically connects a first terminal and a second terminal to each other and a filling member covering the connecting material and filled in the first hole, and the protective member includes an exposure area in which the filling member is disposed, and a thickness from the second basement to an upper surface of the filling member is substantially equal to a thickness from the second basement to an upper surface of the protective member.

BRIEF DESCRIPTION OF THE DRAWINGS

FIG. 1 is a plan view showing a configuration example of a display device of an embodiment.

FIG. 2 is a cross-sectional view of the display panel PNL taken along line A-B including a hole shown in FIG. 1.

FIG. 3 is a plan view illustrating positions of a protection member and a hole with relative to each other.

FIG. 6 is a diagram illustrating a step in a method of manufacturing the display device of the embodiment.

FIG. 7 is a diagram illustrating another step in the method of manufacturing the display device of the embodiment.

FIG. 12 is a plan view showing a modification of the enlargement shown in FIGS. 4 and 5.

FIG. 13 is a plan view showing another modification of the enlargement shown in FIGS. 4 and 5.

FIG. 14 is a diagram showing a basic configuration and an equivalent circuit, of the display panel shown in FIG. 1.

FIG. 15 is a cross-sectional view showing a configuration of a display area DA of the display device shown in FIG. 1.

DETAILED DESCRIPTION

Figure 4:
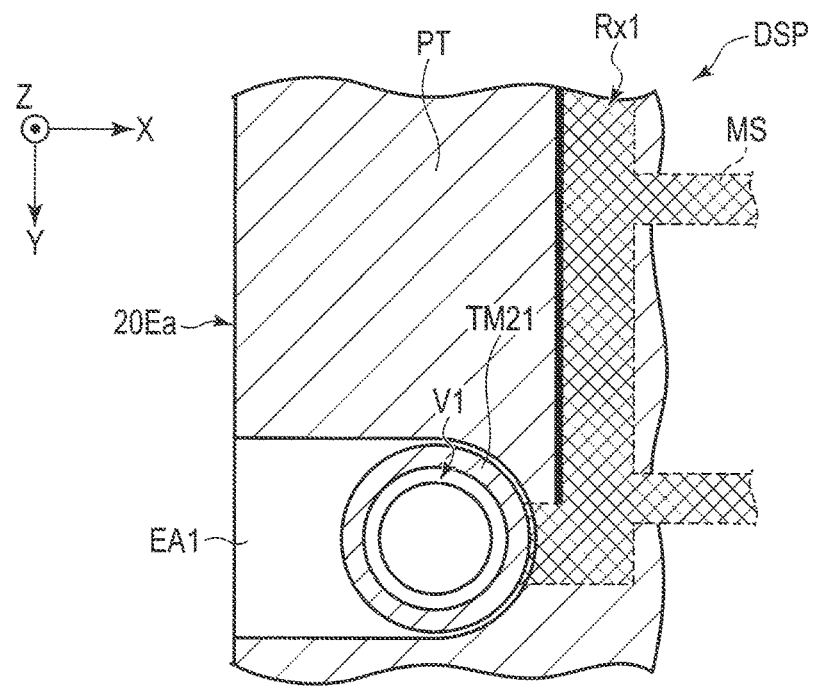
FIG. 4 is an enlarged view of a surrounding of the hole shown in FIG. 3.

In general, according to one embodiment, a display device comprises a first substrate including a first basement and a first terminal, a second substrate including a second basement, a second terminal and a protective member disposed above the second basement, the second substrate opposing the first substrate, an organic insulating layer located between the first basement and the second basement, a first hole penetrating the second basement and the organic insulating layer, a connecting material provided to the first hole to electrically connects the first terminal and the second terminal to each other and a filling member covering the connecting material and filled in the first hole, wherein the protective member comprising an exposure area exposing the first hole and a surrounding thereof on the second basement, the filling member being disposed in the exposure area, and a thickness from the second basement to an upper surface of the filling member being substantially equal to a thickness from the second basement to an upper surface of the protective member.

According to another embodiment, a touch panel comprises a first substrate including a first basement, a first terminal and a drive electrode connected to the first terminal, a second substrate including a second basement, a second terminal, a detection electrode opposing the drive electrode and connected to the second terminal, a protective member covering the second basement and the detection electrode, and opposing the first substrate, an organic insulating layer located between the first basement and the second basement, a first hole penetrating the second basement and the organic insulating layer, a connecting material provided to the first hole to electrically connect the first terminal and the second terminal to each other and a filling member covering the connecting material and filled in the first hole, wherein the protective member including an exposure area which exposes the first hole and a surrounding thereof on the second basement, the filling member being disposed in the exposure area, and a thickness from the second basement to an upper surface of the filling member being substantially equal to a thickness from the second basement to an upper surface of the protective member.

According to another embodiment, a method of manufacturing a display device comprising a first substrate including a first basement and a first terminal, a second substrate including a second basement, a second terminal and a protective member disposed above the second basement, the second substrate opposing the first substrate; an organic insulating layer located between the first basement and the second basement, a first hole penetrating the second basement and the organic insulating layer, and a connecting material provided to the first hole to electrically connects the first terminal and the second terminal to each other, comprises descending a nozzle of a dispenser towards the first hole; discharging the filling member from the nozzle to fill the first hole with the filling member; and sliding the nozzle in a direction separating from the first hole.

Embodiments will be described hereinafter with reference to the accompanying drawings. Note that the disclosure is a mere example presented for the sake of exemplification, and any modification and variation conceived within the scope and spirit of the invention by a person having ordinary skill in the art are naturally encompassed in the scope of invention of the present application. Further, a width, thickness, shape, and the like of each element are depicted schematically in the figures as compared to actual embodiments for the sake of simpler explanation, and they do not limit the interpretation of the invention of the present application. Furthermore, in the description and figures of the present application, structural elements having the same or similar functions will be referred to by the same reference numbers and detailed explanations of them that are considered redundant may be omitted.

In the present embodiment, a display device will be described as an example of an electronic device. This display device can be used in various devices such as smartphones, tablet terminals, mobile phones, notebook computers and game consoles. The main structure described in the present embodiment is applicable to a liquid crystal display device, a self-luminous display device such as an organic electroluminescent display device and an electronic paper display device comprising an electrophoresis element, etc., a display device adopting micro-electromechanical systems (MEMS), and a display device adopting electrochromism.

FIG. 1 is a plan view showing a configuration example of a display device DSP of the present embodiment. A first direction X, a second direction Y, and a third direction Z are orthogonal to each other, but they may cross each other at an angle other than 90 degrees. The first direction X and the second direction Y correspond to directions parallel to a main surface of the substrate which constitutes the display device DSP, and the third direction Z corresponds to a thickness direction of the display device DSP. Here, a plane of the display device DSP in an X-Y plane defined by the first direction X and the second direction Y is shown.

The display device DSP comprises a display panel PNL, an IC chip I1, a wiring substrate SUB3 and the like. The display panel PNL is a liquid crystal display panel, and comprises a first substrate SUB1, a second substrate SUB2, a sealing member SE and a display functional layer corresponding to a liquid crystal layer. The display panel PNL comprises a sensor SS. The second substrate SUB2 opposes the first substrate SUB1. The sealing member SE corresponds to a portion indicated by upward-sloping hatch lines in FIG. 1 and attaches the first substrate SUB1 and the second substrate SUB2 to each other.

In the following explanation, a direction from the first substrate SUB1 toward the second substrate SUB2 is referred to as upward (or merely above), and a direction from the second substrate SUB2 toward the first substrate SUB1 is referred to as downward (or merely below). Further, a view from the second substrate SUB2 to the first substrate SUB1 is defined as a plan view.

The display panel PNL comprises a display area DA which displays images, and a frame-shaped non-display area NDA surrounding the display area DA. The sealing member SE is located within the frame area NDA and the display area DA is located in an inner side surrounded by the sealing member SE.

The wiring substrate SUB3 is mounted on the first substrate SUB1. The wiring substrate SUB3 is, for example, a flexible substrate. A flexible substrate applicable to the present embodiment is a flexible substrate which at least partially includes a flexible portion formed of a bendable material. For example, the wiring substrate SUB3 of the present embodiment may be a flexible substrate which is entirely formed as a flexible portion, or may also be a rigid flexible substrate which includes a rigid portion formed of a hard material such as glass epoxy and a flexible portion formed of a bendable material such as polyimide.

The IC chip I1 is mounted on the wiring substrate SUB3. It is not limited to the example shown in the drawing, but the IC chip I1 may be mounted on the first substrate SUB1 which extends to the outside with respect to the second substrate SUB2 or may be mounted on an external circuit board connected to the wiring substrate SUB3. The IC chip I1 incorporates, for example, a display driver DD which outputs signals necessary to display images. The display driver DD here includes at least a part of a signal line drive circuit SD, a scanning line drive circuit GD and a common electrode drive circuit CD, which will be described later. In the example illustrated, the IC chip I1 incorporates a detection circuit RC which functions as a touch panel controller or the like. The detection circuit RC may be incorporated in some other IC chip than the IC chip I1.

The display panel PNL may be of, for example, a transmissive type which has a transmissive display function of displaying images by selectively transmitting light from below the first substrate SUB1, a reflective type which has a reflective display function of displaying images by selectively reflecting light from above the second substrate SUB2 or a transflective type which has the transmissive display function as well as the reflective display function.

The sensor SS senses contacting or approaching of an object to be detected with respect to the display device DSP. The sensor SE comprises a plurality of detection electrodes Rx (Rx1, Rx2, . . . ). The detection electrodes Rx are disposed on the second substrate SUB2 so as to extend in the first direction X and be arranged to be spaced apart from each other in the second direction Y.

FIG. 1 illustrates the detection electrodes Rx1 to Rx4 as the detection electrodes Rx, and here a configuration example thereof will now be described while focusing on the detection electrode Rx1. In FIG. 1, one end side corresponds to a side left from the display area DA and the other side corresponds to a side right from the display area DA.

The detection electrode Rx1 comprises a detector RS and a connector CN. The detector RS is located in the display area DA and extends in the first direction X. In the detection electrode Rx1, the detector RS is mainly used for sensing. In the example illustrated, each detector RS is formed in a strip shape and, more specifically, formed of an assembly of fine metal wires as explained with reference to FIG. 4. The detection electrodes Rx may be formed of a conductive layer containing a metal or a transparent conductive material such as ITO and IZO, or formed by depositing a transparent conductive layer on a conductive layer containing a metal, or formed of a conductive organic material or a dispersing element of fine conductive material, or the like. Note that one detection electrode Rx1 comprises two detectors RS but may comprise three or more detectors RS or one detector RS. The connector CN is located on the other end side of the frame-like non-display area NDA along the first direction X and connects the detectors RS to each other.

The second substrate SUB2 comprises a plurality of second terminals TM2 (TM21, TM22, . . . ). The second terminal TM21 is connected to the detection electrode Rx1. The second terminal TM21 is formed in a position overlapping the sealing member SE in plan view. The second terminal TM21 is located on one end side of the frame-like non-display area NDA along the first direction X and is connected to the detectors RS.

On the other hand, the first substrate SUB1 comprises a plurality of first terminals TM1 (TM11, TM12, . . . ) and a plurality of wiring lines W (W1, W2, . . . ), electrically connected to the wiring substrate SUB3. The first terminal TM11 and the wiring line W1 are disposed on the frame-like non-display NDA and overlap the sealing member SE in plan view. The first terminal TM11 is formed in a position overlapping the second terminal TM21 in plan view. The wiring line W1 is connected to the first terminal TM11 and extends along the second direction Y, and is electrically connected to the detection circuit RC of the IC chip I1 via the wiring substrate SUB3.

Further, the display device DSP comprises a plurality of holes V (V1, V2, . . . ). A hole (first hole) V1 is formed at a position where the second terminal TM21 and the first terminal TM11 oppose each other. The hole V1 penetrates the second substrate SUB2 including the second terminal TM21 and the sealing member SE. Moreover, the hole V1 may penetrate the first terminal TM11. As will be described later, the hole V1 is provided with the conductive connecting material C. Thus, the second terminal TM21 and the first terminal TM11 are electrically connected to each other. That is, the detection electrode Rx1 provided on the second substrate SUB2 is electrically connected to the detection circuit RC via the wiring substrate SUB3 connected to the first substrate SUB1. The detection circuit RC reads a sensor signal output from a detection electrode Rx and detects whether an object to be detected contacts or approaches or not, and or position coordinates of the object to be detected, or the like.

In the example illustrated, the hole V1 is formed in a circular shape in plan view. The shape is not limited to that of the example illustrated, but may be some other shape such as elliptic.

In the example illustrated, the second terminals TM21, TM23, . . . , first terminals TM11, TM13, . . . , wiring lines W1, W3, . . . , and holes V1, V3, . . . , connected respectively to odd-numbered detection electrodes Rx1, Rx3, . . . , are located in an left end side of the frame-like non-display area NDA. Further, the second terminals TM22, TM24, . . . , first terminals TM12, TM14, . . . , wiring lines W2, W4, . . . , and holes V2, V4, . . . , connected respectively to even-numbered detection electrodes Rx2, Rx4, . . . , are located on a right end side of the frame-like non-display area NDA.

As illustrated, the first terminal TM13 is closer to the wiring substrate SUB3 than the first terminal TM11. In this case, the wiring line W1 detours around an inner side (side close to the display area DA) of the first terminal TM13, and is disposed between the first terminal TM13 and the wiring substrate SUB3 on an inner side of the wiring line W3 along therewith. Similarly, the wiring line W2 detours around an inner side of the first terminal TM14, and is disposed between the first terminal TM14 and the wiring substrate SUB3 on an inner side of the wiring line W4 along therewith.

FIG. 2 is a cross-sectional view of the display panel PNL taken along line A-B including the contact hole V1 shown in FIG. 1. Here, only the main portions necessary for explanation are illustrated and the first alignment film, the second alignment film, etc., are omitted.

In the example illustrated, the display device DSP includes the first substrate SUB1, the second substrate SUB2, the sealing member SE disposed between the first substrate SUB1 and the second substrate SUB2, a liquid crystal layer LC, the connecting material C, a filling member FI1, a film FL and the like.

The first substrate SUB1 comprises a first basement 10, a first terminal TM11, wiring lines W, a source line S, a first insulating layer 11, a second insulating layer 12, a third insulating layer 13, a third terminal TM3 and the like.

The first basement 10 comprises a surface 10A opposing the second substrate SUB2 and a surface 10B on a side opposite to the surface 10A. The first insulating layer 11 comprises an insulating layer 111, an insulating layer 112 and an insulating layer 113. The insulating layer 111, insulating layer 112 and insulating layer 113 are stacked one on another in this order on the first basement 10. The first insulating layer 11 comprises a groove GR. In the example illustrated, the groove GR penetrates the insulating layers 112 and 113. Further, although not illustrated, a semiconductor layer of a switching element is disposed between the insulating layer 111 and the insulating layer 112 in the display area and scanning lines are provided between the insulating layer 112 and the insulating layer 113.

In the example illustrated, the first terminal TM11 is located on a main surface 10A side of the first basement 10, and is disposed inside the groove GR. That is, the first terminal TM11 is in contact with the insulating layer 111. Further, the wiring lines W are disposed on the insulating layer 113. The wiring lines W are located in the same layer as that of the signal line S formed in the display area DA, for example. In this embodiment, the first terminal TM11 is formed together with, for example, the signal line S from the same material in one step. The first terminal TM11 comprises a plurality of slits SL opposing the sealing member SE along the third direction Z. The second insulating layer 12 covers the first terminal TM11, the wiring lines W and the source line S, and is disposed on the insulating layer 113 as well. The third insulating layer 13 is provided on the second insulating layer 12.

Note that in the position overlapping the groove GR, the insulating layer 111 may penetrate to reach the first basement 10, and the first terminal TM1 disposed inside the groove GR may be in contact with the first basement 10.

The third terminal TM3 is located between the second insulating layer 12 and the sealing member SE. The third terminal TM3 is electrically connected to the first terminal TM1 through a contact hole CH which penetrates the second insulating layer 12 to the first terminal TM1.

The second substrate SUB2 comprises a second basement 20, a second terminal TM21, a detection electrode Rx1, a protective member PT, a light-shielding layer BM, an overcoat layer OC and the like.

The second basement 20 comprises a main surface 20A opposing the first substrate SUB1 and a main surface 20B on a side opposite to the main surface 20A. The main surface 20A opposes the first terminal TM11, and is spaced from the first terminal TM11 along the third direction Z. The first basement 10 and the second basement 20 described above are formed from, for example, nonalkali glass. The first basement 10 and the second basement 20 may be formed from a resin. The light-shielding layer BM is located on the main surface 20A of the second basement 20. The overcoat layer OC covers the light shielding layer BM.

In the example illustrated, the second terminal TM21 and the detection electrode Rx1 are located on the main surface 20B side. The second terminal TM21 and the detection electrode Rx1 are electrically connected to each other. The protective member PT is disposed above the second terminal TM21 and the detection electrode Rx1. As will be described later, the protective member PT comprises an exposure area EA1 which exposes the hole V1 and its surrounding on the second basement 20. Further, although not illustrated, various insulating layers and conductive layers may be provided between the second terminal TM21 and detection electrode Rx1 and the second basement 20.

The sealing member SE attaches the first substrate SUB1 and the second substrate SUB2 to each other. As described above, the slit SL located in a position where the first terminal TM11 overlaps the sealing member SE. With this configuration, it is possible to allow ultraviolet rays to reach the sealing member SE when irradiating ultraviolet rays from below the display device DSP to harden the sealing member SE. The liquid crystal layer LC is located in an arrear surrounded by the first substrate SUB1, the second substrate SUB2 and the sealing member SE. Here, the light-shielding layer BM, the overcoat layer OC and the sealing member SE are together referred to as an organic insulating layer OI. The organic insulating layer OI is disposed between the first basement 10 and the second basement 20.

Although not illustrated, the first alignment film may be located on a sealing member SE side of the first substrate SUB1. Further, the second alignment film may be located on a sealing member SE side of the second substrate SUB2.

The first terminal TM1 and the second terminal TM2 may be formed of, for example, a metal material such as molybdenum, tungsten, titanium, aluminum, silver, copper or chromium, or an alloy of these metal materials, or a transparent conductive material such as indium tin oxide (ITO) or indium zinc oxide (IZO), and may have a single layer structure or a multilayer structure. The first terminal TM1 is formed of, for example, a metal material containing aluminum. Further, in terms of manufacturing process, it is preferable not to use a metal material containing that having a higher melting point compared to that of aluminum, such as molybdenum or tungsten for the first terminal TM1.

Here, the connection structure between the first terminal TM11 and the second terminal TM21 in this embodiment will be explained in full detail.

The hole V1 penetrates the display panel PNL between the first terminal TM11 and the second terminal TM21. The hole V1 penetrates at least the second basement 20 and the organic insulating layer OI. The hole V1 includes hole portions VA, VB and VC and a concavity CC.

The hole portion VA penetrates the second basement 20 between the main surface 20A and the main surface 20B. In the example illustrated, the hole VA penetrates the second terminal TM21. The hole portion VB penetrates the organic insulating layer OI. The hole portion VB is communicated with the hole portion VA.

The hole portion VC penetrates the third terminal TM3, the second insulating layer 12, the first terminal TM11 and the insulating layer 111. The hole portion VC is communicated with the hole portion VB. The first basement 10 includes a concavity CC opposing the hole portion VC along the third direction Z. The concavity CC is formed from the surface 10A to the surface 10B, but does not penetrate to reach the surface 10B in the example illustrated. For example, a depth of the concavity CC along the third direction Z is approximately one fifth to approximately a half of the thickness of the first basement 10 along the third direction Z. Note that the first basement 10 may include a hole penetrating between the surfaces 10A and 10B instead of the concavity CC. The hole portions VA, VB and VC and the concavity CC are located on the same straight line along the third direction Z.

In the example illustrated, the hole portion VB is expanded in the second direction Y as compared with the holes VA and VC. Note that the hole portion VB is expanded larger than the hole portion VA or VC not only along the second direction Y but also in all directions in the X-Y plane.

The connecting material C electrically connects the first terminal TM11 and the second terminal TM21 through the hole V1. More specifically, the connecting material C is provided on an inner surface of each of the hole portions VA, VB and VC and the concavity CC. In the hole portion VA, the connecting material C is brought into contact with the inner surface of each of the second basement 20 and the second terminal TM21, and in the hole portion VB, in contact with the inner surface of each of the light-shielding layer BM, the overcoat layer OC and the sealing member SE, and in the hole portion VC, in contact with the inner surface of each of the third terminal TM3, the second insulating layer 12, the first terminal TM11 and the insulating layer 111. In the example illustrated, the connecting material C is provided in the hole portions VA, VB and VC and the concavity CC without being broken. It is preferable that the connecting material C should include a metal material such as silver, and should include fine particles of a particle diameter of the order of several nanometers to several tens of nanometers, mixed into an organic solvent.

In this embodiment, the solvent of the connecting material C evaporates in a manufacturing step, and therefore the connecting material C attached to a wall surface of the hole V1 may be of a metal-made thin film.

In the example illustrated, the connecting material C is provided on the inner surface of each of the hole portions VA, VB and VC and the concavity CC, but it may be provided to fill up the hole portions VA, VB and VC and the concavity CC. In this case as well, the connecting material C is formed continuously without being broken between the first terminal TM11 and the second terminal TM21.

The hole V1 is filled with the filling member FI1. Specifically, the filling member FI1 is loaded into a hollow section of the connecting material C. Further, the filling member FI1 covers the second terminal TM21, the connection wiring line C and the second basement 20 in the exposure area EA1. The filling member FI1 is, for example, insulating property and is formed from an organic insulating material. With the filling member provided as described above, a stepped portion in the third direction Z caused by forming the hollow in the connecting material C can be reduced. Moreover, the connecting material C can be protected. Note here that the filling member FI1 may have conductivity and be of one obtained, for example, by hardening a paste containing conductive particles such as of silver. When the filling member FI1 has conductivity, the filling member FI1 can electrically connect the first terminal TM11 and the second terminal TM21 to each other even if the connecting material C is broken, thereby making it possible to improve the reliability.

The filling member FI1 is formed from, for example, an organic material, and specifically, from a UV curing resin such as epoxy acrylate or a carbon material in this embodiment. Moreover, for example, the viscosity of the material used for the filling member FI is about 30 to 60 Pascal seconds.

With the above-described configuration, the second terminal TM21 is electrically connected to the wiring substrate SUB3 shown in FIG. 1 via the connecting material C, the first terminal TM11 and the like. Thus, a control circuit configured to write signals to the detection electrodes Rx and read signals output from the detection electrodes Rx can be connected to the detection electrodes Rx via the wiring substrate SUB3. Therefore, there is no need to mount another wiring substrate to connect the detection electrodes Rx and the control circuit, on the second substrate SUB2.

The film FL is disposed above the second basement 20. The film FL is attached to an upper surface US1 of the filling member FI1 and an upper surface US2 of the protective member PT with an adhesive GL. That is, the adhesive GL is interposed between the film FL and the filling member FI1 and between the film FL and the protective member PT. Here, a thickness T1 from the second basement 20 to the upper surface US2 of the filling member FI1 1 is approximately equal to a thickness T2 from the second basement 20 to the upper surface US2 of the protective member PT. The film FL is formed from, for example, a transparent material. The film FL is, for example, a protective film or an optical film such as a polarizer. In the example illustrated, an end FLE of the film FL is located on the same plane as that of an end 20Ea of the second basement 20, but the end FLE may be located on an outer side of the display panel PNL with respect to the end 20Ea. Moreover, in this embodiment, the thickness of the adhesive GL along the third direction Z is, for example, about 50 μm. Here, even if there is a trench portion on a boundary between the protective member PT and the filling member FI1, it is buried with the adhesive GL.

According to this embodiment, the thicknesses T1 and T2 are approximately equal to each other and the upper surfaces US1 and US2 are located on the approximately same plane. Therefore, a stepped portion is not created between the filling member FI1 and the protective member PT, thereby making it possible to suppress the entering of air bubbles between the adhesive GL and the filling member FI1 and between the adhesive GL and the protective member PT. Therefore, degradation of the appearance of the display device DSP, caused by air bubbles and the peeling off of the film FL caused by thermal expansion of air bubbles can be suppressed. Thus, the reliability of the display device DSP can be improved.

FIG. 3 is a plan view illustrating the positions of the protective member PT and the holes V1 to V4 with relative to each other.

The protective member PT is formed substantially all over the surface of the second substrate SUB2. In the example illustrated, the protective member PT comprises exposure areas EA1 to EA4 which expose the second substrate, in positions overlapping the holes V1 to V4, respectively. The exposure areas EA1 to EA4 overlap the holes V1 to V4, respectively. The exposure areas EA1 to EA4 extend to the end of the second basement 20.

The filling members FI1 to FI4 disposed in positions overlapping the exposure areas EA1 to EA4, respectively, in plan view. The filling members FI1 to FI4 extend to the end of the second basement 20 along a direction in which the exposure areas EA1 and EA4 each extend.

FIG. 4 is an enlarged view of the surrounding of the hole V1 shown in FIG. 3. FIG. 4 mainly shows the position of the protective member PT, and omits the filling member FI1 from the illustration.

The second terminal TM21 is formed into a ring shape. The detection electrode Rx1 is formed from mesh metal thin wires MS. The hole V1 is located on an inner side of the second terminal TM21. The exposure area EA1 overlaps the second terminal TM21 and the hole V1 in plan view.

Figure 5:
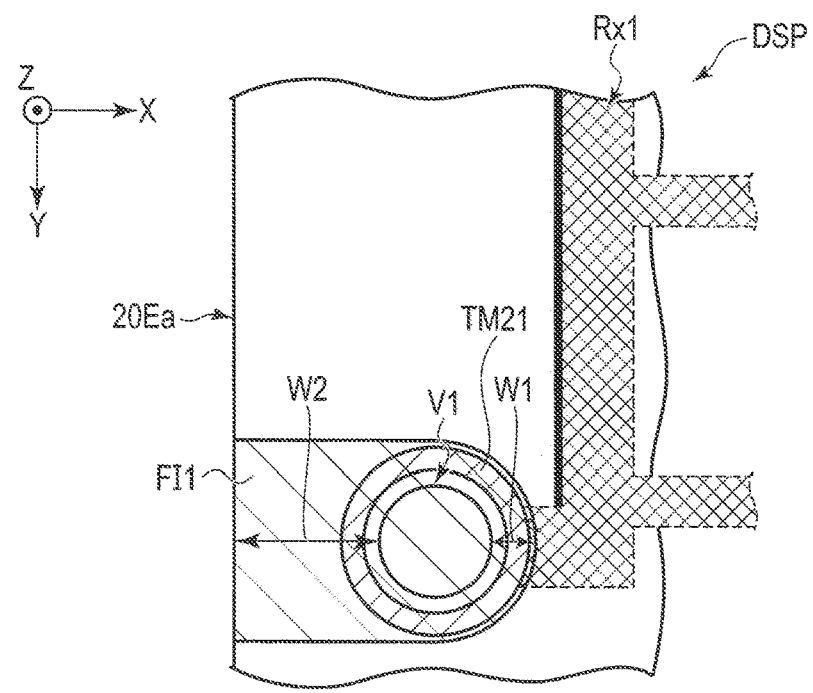
FIG. 5 is an enlarged view of a surrounding of the hole shown in FIG. 3.

FIG. 5 is an enlarged view of the surrounding of the hole V1 shown in FIG. 3. FIG. 5 mainly shows the position of the filling member FI1 and omits the protective member PT from illustration.

The filling member FI1 overlaps the second terminal TM21 and the hole V1 in plan view. Further, as described above, the filling member FI1 extends from the hole V1 to the end 20Ea along the first direction X. Here, the area in which the filling member FI1 is formed is approximately equal to the area in which the exposure area EA1 is formed in FIG. 4. A width W1 of the filling member FI1 between the hole V1 and the detection electrode Rx1 is less than a width W2 of the filling member FI1 between the hole V1 and the end 20Ea of the second basement 20.

Next, an example of a method of manufacturing the above-described display device DSP will be described with reference to FIGS. 6 to 9.

FIGS. 5 and 6 are diagrams each showing a step in the method of manufacturing the display device DSP of this embodiment. FIGS. 6 to 9 each shows a cross section of the display panel PNL taken along line A-B, which includes the hole V1 shown in FIG. 1. Note that only the main portions necessary for explanation are illustrated here. FIG. 6 shows a step following the formation of the connecting material C.

As shown in FIG. 6, the display panel PNL is prepared. In the illustrated display panel PNL, the first substrate SUB1 comprises the first terminal TM11 disposed on the main surface 10A side, and the second substrate SUB2 comprises the second terminal TM21 disposed on the main surface 20B side. The organic insulating layer OI is disposed between the first basement 10 and the second basement 20. The exposure area EA1 is formed in the protective member PT. Here, the second terminal TM21, the connecting material C and the second basement 20 are exposed in the exposure area EA1.

First, as shown in FIG. 6, a nozzle NZ of a dispenser DP is descended towards the hole V1. In the example illustrated, the nozzle NZ is descended along a direction a perpendicular to the main surface 20B. Here, the direction a is a direction parallel to the third direction Z. Here, the nozzle NZ opposes the hole V1 along the third direction Z. In this embodiment, a hole V1-side distal end of the nozzle NZ is formed of, for example, polytetrafluoroethylene.

Next, as shown in FIG. 7, the filling member FI1 is discharged from the nozzle NZ to fill the hole V1 therewith.

Figure 8:
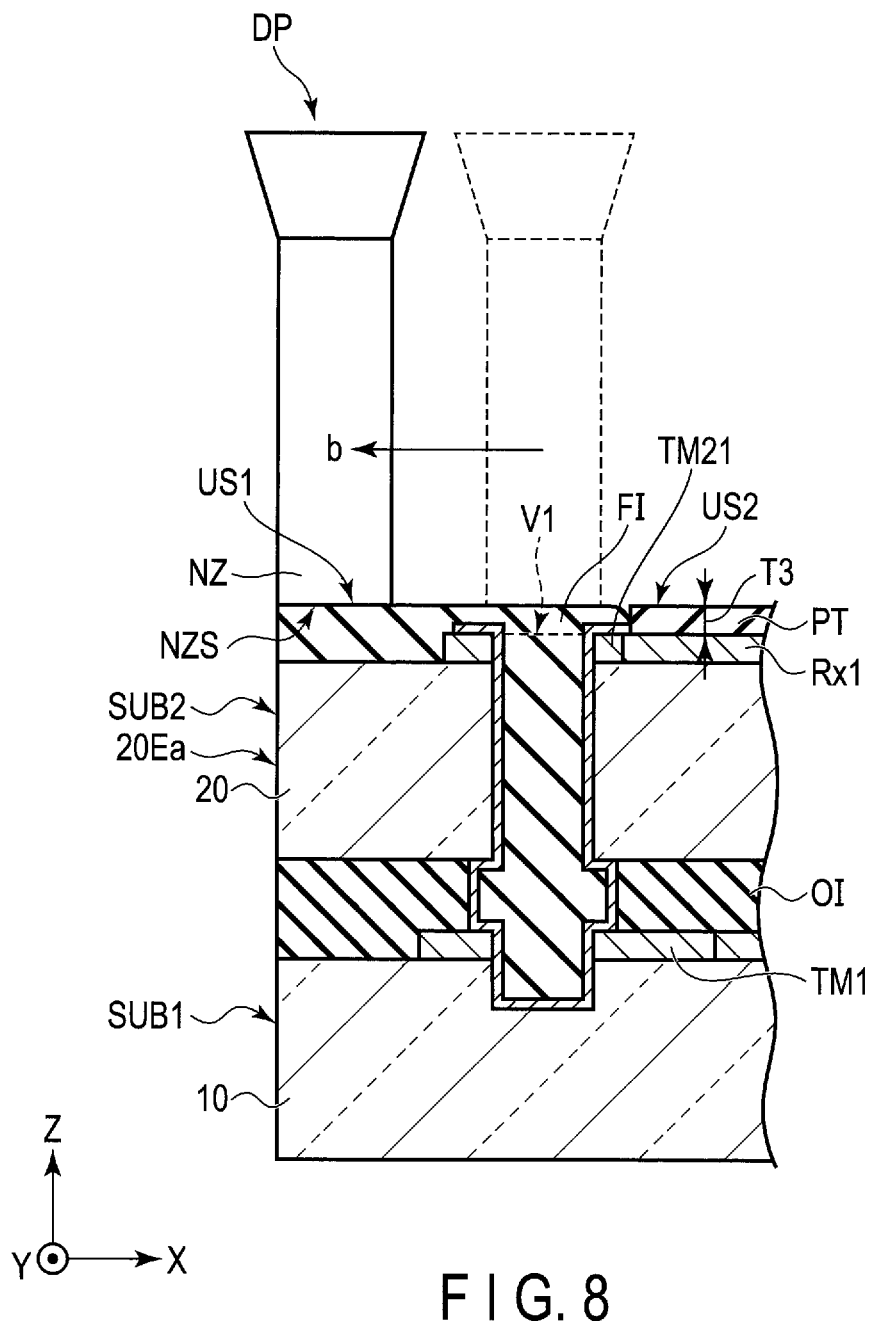
FIG. 8 is a diagram illustrating another step in the method of manufacturing the display device of the embodiment.

Next, as shown in FIG. 8, while the discharge of the filling member FI1 from the nozzle NZ is stopped, the nozzle NZ is slid in a direction separating away from the hole V1. In the example illustrated, the sliding direction is towards the end 20Ea of the second basement 20. That is, the nozzle NZ is slid from the position opposing the hole V1 to the end 20Ea. Here, a distal end surface NZS of the nozzle NZ slides on substantially the same plane as the upper surface US2 of the protective member PT. Thus, the upper surface US1 of the filling member FI1 is located on the same plane as that of the upper surface US2. In the example illustrated, the nozzle NZ is slid to the end 20Ea, but it suffices if it is slid to between the hole V1 and the end 20Ea without being slid to the end 20Ea.

Figure 9:
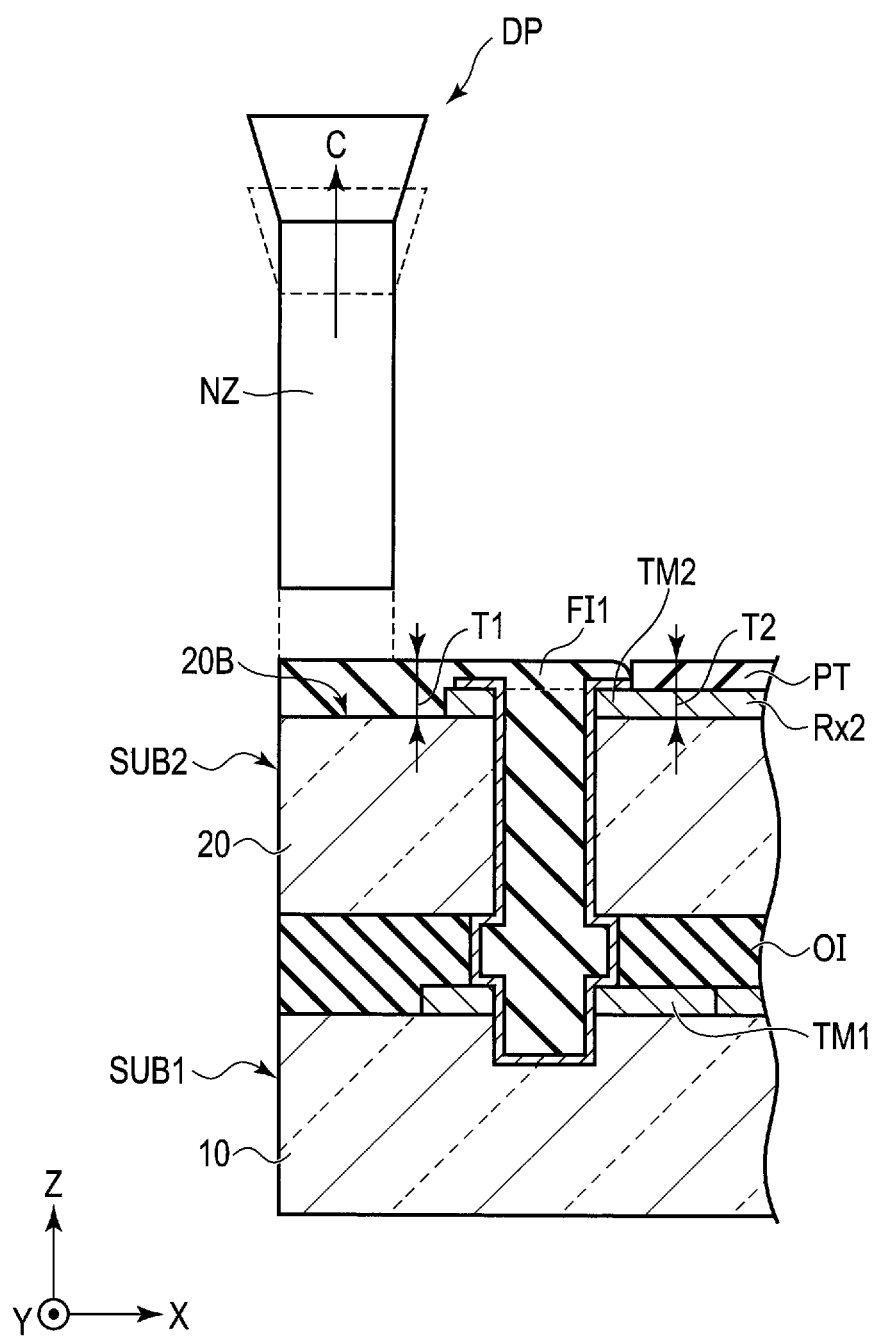
FIG. 9 is a diagram illustrating a following step in the method of manufacturing the display device of the embodiment.

Next, as shown in FIG. 9, the nozzle NZ of the dispenser DP is ascended. In the example illustrated, the nozzle NZ is ascended along a direction c perpendicular to the main surface 20B. Here, the direction c is parallel to the third direction Z.

In the above-described step, the nozzle NZ is slid in the direction parallel to the main surface 20B after filling the hole V1 with the filling member FI1. In this manner, as compared with the case where the nozzle NZ is ascended in the position opposing the hole V1, it is possible to suppress the thickness T1 from becoming greater than the thickness T2.

Figure 10:
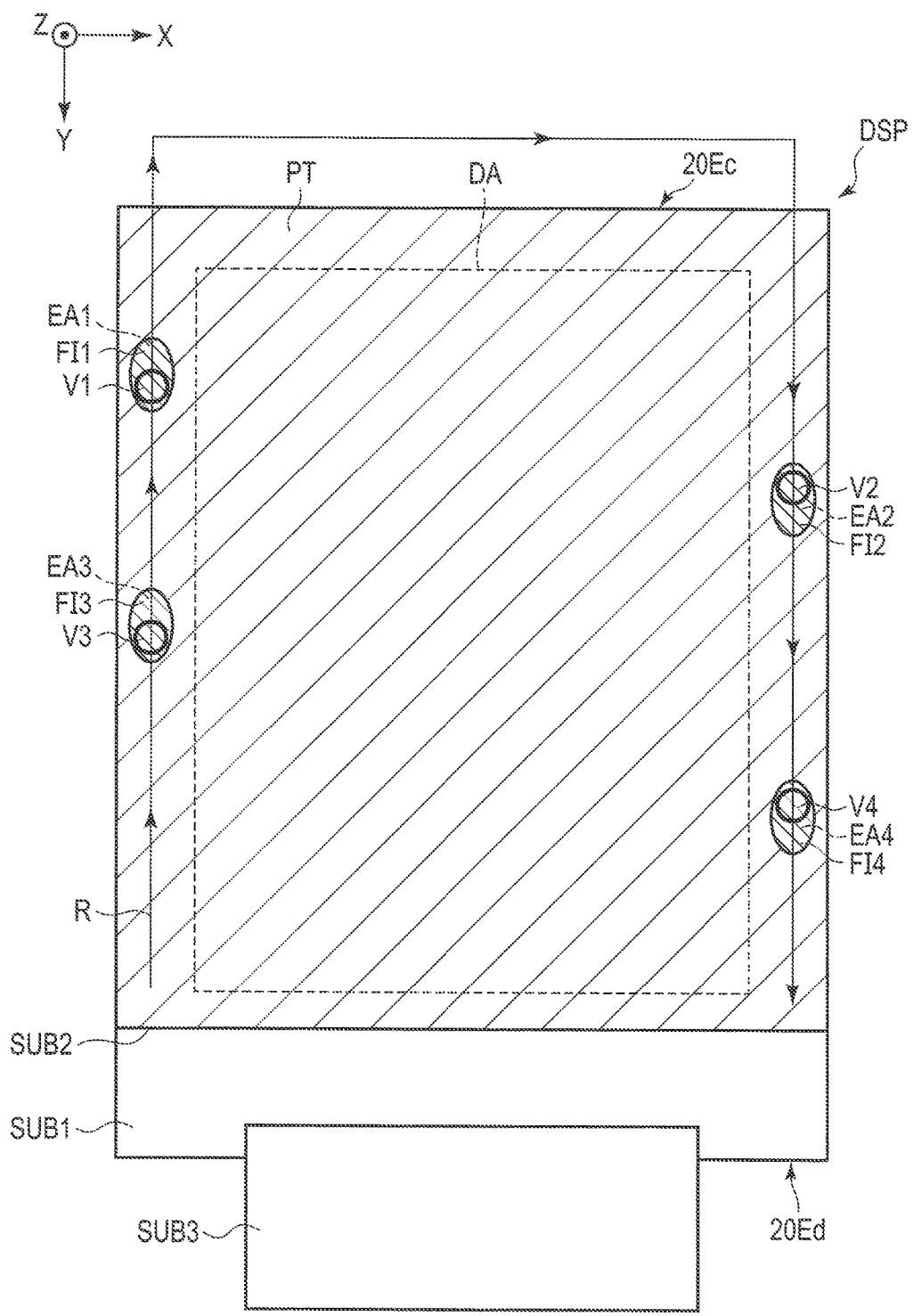
FIG. 10 is a plan view showing another example of positions of the positions of the protection member and hole with relative to each other.

FIG. 10 is a plan view showing another example of the positions of the protective member PT and the holes V1 to V4 with relative to each other. The structure shown in FIG. 10 is different from that of FIG. 3 in the shape of the exposure areas EA1 to EA4.

The exposure areas EA1 to EA4 overlap the holes V1 to V4, respectively. The exposure areas EA1 to EA4 extend in the direction separating from the holes V1 to V4 in plan view. That is, the exposure areas EA1 and EA3 extend from the holes V1 and V3, respectively, toward the end 20Ec of the second basement 20. The exposure areas EA2 and EA4 extend from the holes V2 and V4, respectively, toward the end 20Ed of the second basement 20. In other words, the exposure areas EA1 to EA4 extend along the second direction Y.

The holes V1 to V4 and the filling members FI1 to FI4 illustrated are formed along the second direction Y. With this configuration, one end portion and the other end portion of the frame-like non-display area NDA do not require such a great width along the first direction X as compared with the case where they are formed along the first direction X as shown in FIG. 3, it is possible to cope with the narrowing of the frame of the display panel PNL.

Further, a route R in FIG. 10 indicates a route of the nozzle for discharging the filling member. As compared to the case of FIG. 3, the nozzle can be moved on a straight line in one end side and the other end side in plan view. Thus, it is possible to improve the efficiency of the step of forming the filling member.

In this configuration example as well, an advantageous effect similar to that explained above can be obtained.

Figure 11:
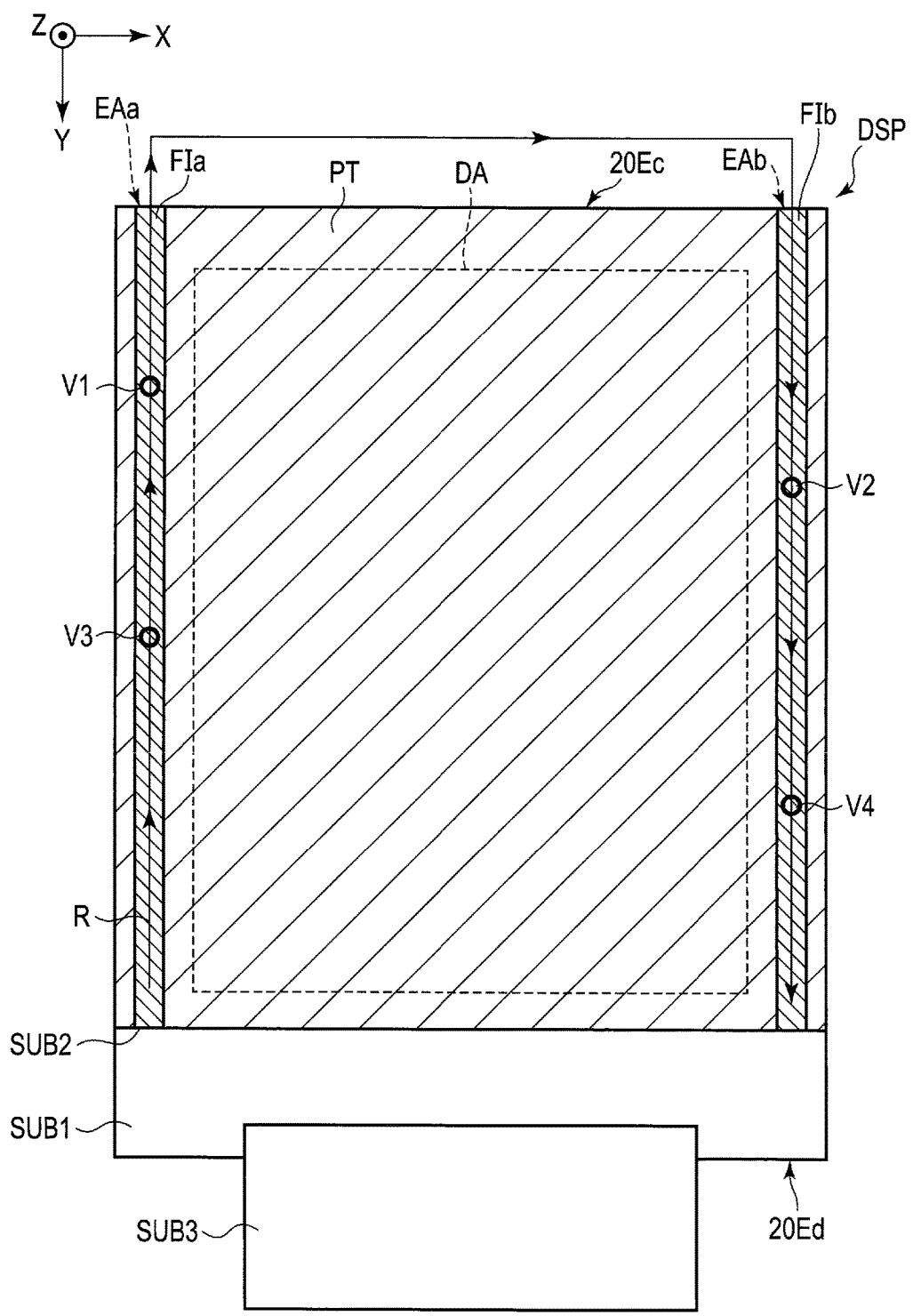
FIG. 11 is a plan view showing another example of positions of the positions of the protection member and hole with relative to each other.

FIG. 11 is a plan view showing another example of the positions of the protective member PT and the holes V1 to V4 with relative to each other. The structure shown in FIG. 11 is different from that of FIG. 3 in the shape of the exposure areas EAa and EAb.

The exposure area EAa overlaps the holes V1 and V3. The exposure area EAb overlaps the holes V2 and V4. The exposure areas EAa and EAb each extend from the end 20Ec to the end 20Ed. That is, the exposure areas EAa and EAb extend along the second direction Y. The structure in which the filling member is provided to cover the exposure areas is similar to that of the above-described embodiment.

The shape of the filling member FIa illustrated is formed by moving the nozzle from the end 20Ed to the 20Ec while discharging the filling member FIa to place it in the exposure area EAa including the holes V1 and V3. Further, the shape of the filling member FIb is formed by moving the nozzle from the end 20Ec to the 20Ed while discharging the filling member Fib to place it in the exposure area EAb including the holes V2 and V4.

In this configuration example as well, an advantageous effect similar to that explained above can be obtained.

FIG. 12 is a plan view showing a modification of the enlarged views shown in FIGS. 4 and 5. The example shown in FIG. 12 is different from those of FIGS. 4 and 5 in that the display device DSP comprises a second terminal TM211 connected to the second terminal TM21.

The second terminal TM211 is formed into a ring shape and located by the second terminal TM21 along the second direction Y. The second terminal TM211 is connected to the second terminal TM21 by a connection wiring line CW. The hole (second hole) V11 is located inside the second terminal TM211. The exposure area EA11 overlaps the second terminal TM211 and the hole V11 in plan view. Further, the exposure area EA11 extends along the first direction X from the hole V11 to the end 20Ea. The exposure area EA11 is spaced from the exposure area EA1.

The filling member FI11 is disposed in a position overlapping the exposure area EA11 in plan view. The filling member FI11 overlaps the second terminal TM211 and the hole V11 in plan view. Moreover, the filling member FI11 extends along the first direction X from the hole V11 to the end 20Ea. The filling member FI11 illustrated is formed in a similar process to that shown in FIGS. 6 to 9.

In this configuration example as well, an advantageous effect similar to that explained above can be obtained.

FIG. 13 is a plan view showing a modification of the enlarged views shown in FIGS. 4 and 5. The example shown in FIG. 13 is different from that of FIG. 12 in that the exposure area EA1 and the filling member FI1 overlap the second terminal TM211 and the hole V11 in plan view.

The exposure area EA1 extends along the second direction Y. The exposure area EA1 includes regions between the holes V1 and V11 and between the holes V1 and V11. The filling member FI1 overlaps the exposure area EA1 in plan view and extends along the second direction Y. The holes V1 and V11 are filled with the filling member FI1, which is disposed also between the holes V1 and V11.

The shape of the filling member FI1 illustrated is formed, for example, by filling the hole V1 with the filling member FI1 from the nozzle, then stopping the discharge of the filling member FI1 and sliding the nozzle to the hole V11. That is, the sliding direction is parallel to the end 20Ea. Note that after filling the holes V1 and V11 by discharging the filling member FI1 thereto, the discharge of the filling member FI1 from the nozzle may be stopped, and the nozzle may be slid from the hole V11 toward the end 20Ec. That is, in addition to the above-described configuration, the filling member FI1 may include a portion extending from the hole V11 to the end 20Ea.

In this configuration example as well, an advantageous effect similar to that explained above can be obtained.

FIG. 14 is a diagram showing a basic configuration and an equivalent circuit, of the display panel PNL shown in FIG. 1.

The display panel PNL includes a plurality of pixels PX in the display area DA. Here, the pixel is defined as a minimum unit which is individually controllable according to a pixel signal, and is provided, for example, in an area which includes a switching element provided in a position in which a scanning line and a signal line, which will be described later, cross each other. The pixels PX are arranged in a matrix in the first direction X and the second direction Y. The display panel PNL comprises a plurality of scanning lines G (G1 to Gn), a plurality of signal lines S (S1 to Sm), a common electrode CE and the like in the display area DA. The scanning lines G, the signal lines S and the common electrode CE are each drawn to the frame-like non-display area NDA. In the frame-like non-display area NDA, the scanning lines G are connected to the scanning line drive circuit GD, the signal lines S are connected to the signal line drive circuit SD, and the common electrode CE is connected to the common electrode drive circuit CD.

FIG. 15 is a cross-section of a configuration in the display area DA of the display panel PNL shown in FIG. 1. Here, explanation of the same members of the structure shown in FIG. 2 will be omitted.

The display device DSP illustrated is configured to conform to a display mode mainly using a lateral electric field which is substantially parallel to a surface of the substrate. Note that the display panel PNL may be configured to conform to a display mode using a longitudinal electric field perpendicular to the surface of the substrate, an electric field inclined to the surface of the substrate or a combination of these electric fields. The surface of the substrate is a surface parallel to the X-Y plane.

As shown in FIG. 15, the first substrate SUB1 includes the first basement 10, on an upper surface of which, the first insulating layer 11, the signal lines S, the second insulating layer 12, the common electrode CE, the metal layer M, the third insulating layer 13, the pixel electrodes PE, the first alignment film AL1 and the like are stacked one on another in this order. Here, the switching element, the scanning lines, various insulating layers interposed therebetween, and the like are not illustrated.

The second substrate SUB2 includes the second basement 20, on a lower surface of which the light-shielding layer BM, the color filter CF, the overcoat layer OC and the second alignment film AL2 are stacked one on another in this order, and on upper surface of which, the detection electrodes Rx and the protective member PT are stacked one on another in this order.

A first optical element OD1 including a polarizer is located between the first basement 10 and an illumination device BL. A second optical element OD2 including a polarizer is located on the detection electrodes Rx. More specifically, the second optical element OD2 is attached to the protective member PT with the adhesive GL. In the example illustrated, the second optical element OD2 corresponds to the film FL shown in FIG. 2.

Next, a configuration example of the sensor SS mounted in the display device DSP of this embodiment will be described.

Figure 16:
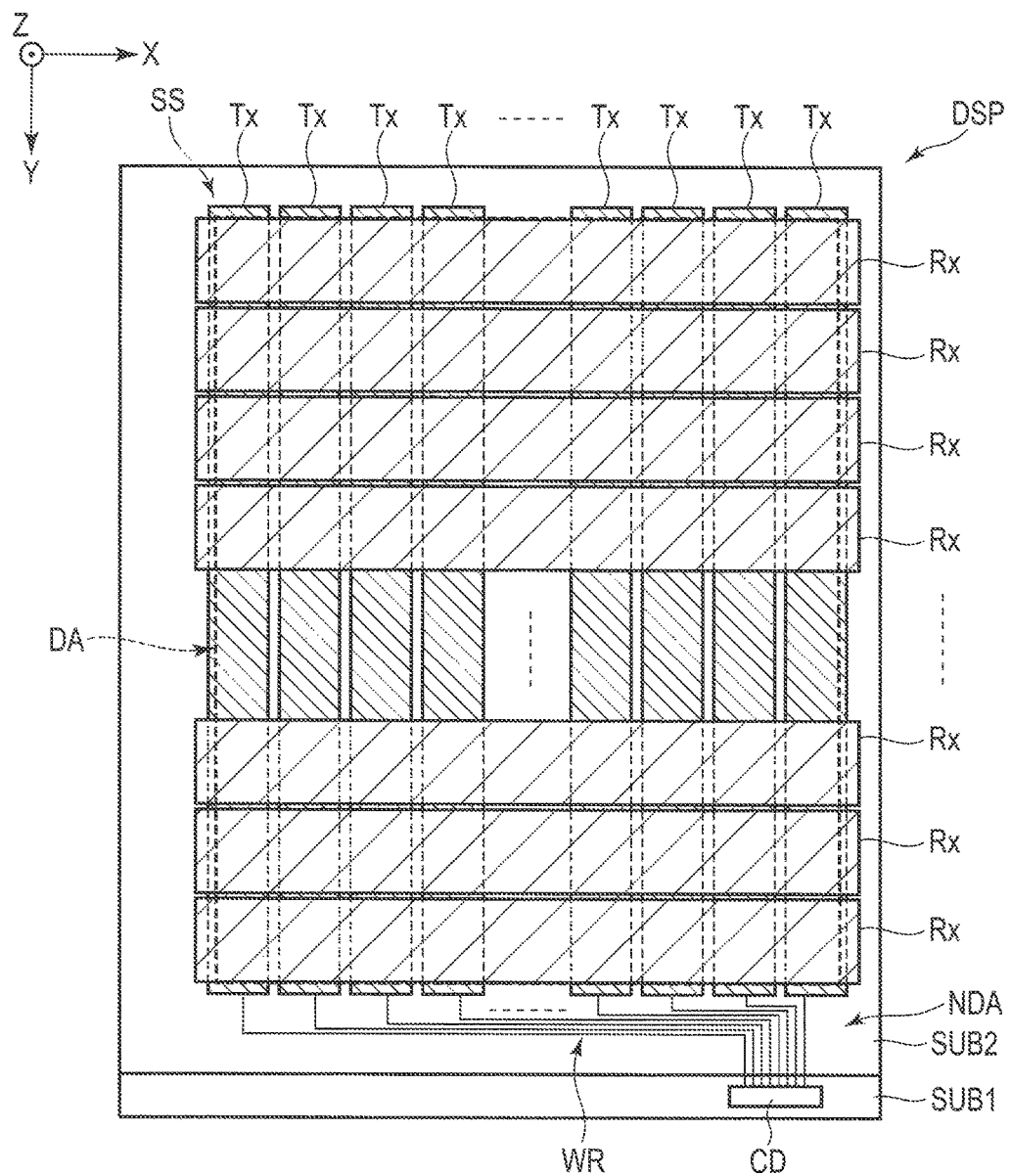
FIG. 16 is a plan view showing a configuration example of a sensor.

FIG. 16 is a plan view showing a configuration example of the sensor SS.

In the configuration example illustrated, the sensor SS includes sensor drive electrodes Tx and detection electrodes Rx. In the example illustrated, the sensor drive electrodes Tx correspond to portions represented by downward sloping hatch lines and are provided on the first substrate SUB1. Further, the detection electrodes Rx correspond to portions represented by upward sloping hatch lines, and are provided on the second substrate SUB2. The sensor drive electrodes Tx and the detection electrodes Rx cross each other in the X-Y plane.

In the example illustrated, the sensor drive electrodes Tx each have a strip-like shape elongated in the second direction Y, and are arranged in the first direction X at intervals. Each sensor drive electrode Tx is electrically connected to the common electrode drive circuit CD via a wire line WR.

In this embodiment, the sensor drive electrodes Tx are formed from the common electrode CE. That is, as shown in FIG. 16, the common electrode CE is formed to be strip-shaped in this embodiment. The sensor drive electrodes Tx (common electrode CE) have a function of producing an electric field between the pixel electrodes PE and a function of detecting the position of an object by generating the capacitance between the own electrodes and the detection electrodes Rx.

The common electrode drive circuit CD supplies common drive signals to the sensor drive electrodes Tx in a display period to display images on the display area DA. In a sensing period (touch period) in which sensing is to be executed, the common electrode drive circuit CD supplies sensor drive signals to the sensor driving electrodes Tx. As the sensor drive signals are supplied to the sensor drive electrodes Tx, the detection electrodes Rx outputs sensor signals necessary for sensing (that is, signals based on a change in inter-electrode capacitance between the sensor driving electrodes Tx and the detection electrodes Rx). The detection signals output from the detection electrodes Rx are input to the detection circuit RC shown in FIG. 1.

The sensor SS in each of the above-described configuration examples is not limited to the mutual-capacitive type which detects an object based the change in electrostatic capacitance between a pair of electrodes (the electrostatic capacitance between the sensor drive electrodes Tx and the detection electrodes Rx in the above-provided example), but may be the self-capacitive type which detects an object based the change in electrostatic capacitance of the detection electrodes Rx.

In the example illustrated, the sensor drive electrodes Tx each extend along the second direction Y and are arranged along the first direction X at intervals, but they may each extend along the first direction X and be arranged along the second direction Y at intervals, in which case, the detection electrodes Rx each extend along the second direction Y and are arranged along the first direction X at intervals.

As described above, according to the embodiments, a display device which can narrow the frame can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a first substrate including a first basement and a first terminal;
   a second substrate including a second basement, a second terminal and a protective member disposed above the second basement, the second substrate opposing the first substrate;
   an organic insulating layer located between the first basement and the second basement;
   a first hole penetrating the second basement and the organic insulating layer;
   a connecting material provided to the first hole to electrically connects the first terminal and the second terminal to each other; and
   a filling member covering the connecting material and filled in the first hole; wherein
   the protective member comprising an exposure area exposing the first hole and an area of the second basement surrounding the first hole,
   the filling member being disposed in the exposure area, and a thickness from the second basement to an upper surface of the filling member being substantially equal to a thickness from the second basement to an upper surface of the protective member.

2. The display device of claim 1, wherein
the exposure area extends in a direction separating from the first hole in plan view.

3. The display device of claim 2, wherein
the filling member extends along a direction in which the exposure area extends.

4. The display device of claim 1, wherein
the exposure area extends to an end of the second basement.

5. The display device of claim 1, further comprising:
a detection electrode connected to the second terminal, wherein
a width of the filling member between the detection electrode and the first hole is less than a width of the filling member between the first hole and an end of the second basement.

6. The display device of claim 1, further comprising:
a second hole disposed by the first hole;
wherein
the exposure area includes the second hole and a region between the first hole and the second hole, and
the filling member is filled in the second hole and also disposed between the first hole and the second hole.

7. The display device of claim 1, further comprising:
a film attached on the upper surface of the filling member and the upper surface of the protective member.

8. The display device of claim 1, wherein
the first substrate comprises a pixel electrode and a common electrode opposing the pixel electrode.

9. A touch panel comprising:
a first substrate including a first basement, a first terminal and a drive electrode connected to the first terminal;
a second substrate including a second basement, a second terminal, a detection electrode opposing the drive electrode and connected to the second terminal, a protective member covering the second basement and the detection electrode, the second substrate opposing the first substrate;
an organic insulating layer located between the first basement and the second basement;
a first hole penetrating the second basement and the organic insulating layer;
a connecting material provided to the first hole to electrically connect the first terminal and the second terminal to each other; and
a filling member covering the connecting material and filled in the first hole, wherein
the protective member including an exposure area exposing the first hole and an area of the second basement surrounding the first hole,
the filling member being disposed in the exposure area, and
a thickness from the second basement to an upper surface of the filling member being substantially equal to a thickness from the second basement to an upper surface of the protective member.

10. The touch panel of claim 9, wherein
the exposure area extends in a direction separating from the first hole in plan view.

11. The touch panel of claim 10, wherein
the filling member extends along a direction in which the exposure area extends.

12. The touch panel of claim 9, wherein
the exposure area extends to an end of the second basement.

13. The touch panel of claim 9, wherein
a width of the filling member between the detection electrode and the first hole is less than a width of the filling member between the first hole and an end of the second basement.

14. The touch panel of claim 9, further comprising:
a second hole disposed by the first hole;
wherein
the exposure area includes the second hole and a region between the first hole and the second hole, and
the filling member is filled in the second hole and also disposed between the first hole and the second hole.

15. The touch panel of claim 9, further comprising:
a film attached on the upper surface of the filling member and the upper surface of the protective member.

16. A method of manufacturing a display device comprising:
a first substrate including a first basement and a first terminal;
a second substrate including a second basement, a second terminal and a protective member disposed above the second basement, the second substrate opposing the first substrate;
an organic insulating layer located between the first basement and the second basement;
a first hole penetrating the second basement and the organic insulating layer; and
a connecting material provided to the first hole to electrically connects the first terminal and the second terminal to each other,
the method comprising:
descending a nozzle of a dispenser towards the first hole;
discharging the filling member from the nozzle to fill the first hole with the filling member; and
sliding the nozzle in a direction separating from the first hole.

17. The method of claim 16, wherein
a direction of the sliding is a direction towards the end of the second basement.

18. The method of claim 16, wherein
a direction of the sliding is a direction parallel to the end of the second basement.

* * * * *